US006925001B2

(12) United States Patent
Hsu (10) Patent No.: US 6,925,001 B2
(45) Date of Patent: Aug. 2, 2005

(54) ELECTRICALLY PROGRAMMABLE RESISTANCE CROSS POINT MEMORY SENSING METHOD

(75) Inventor: Sheng Teng Hsu, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 10 days.

(21) Appl. No.: 10/794,309

(22) Filed: Mar. 3, 2004

(65) Prior Publication Data

US 2004/0170048 A1 Sep. 2, 2004

Related U.S. Application Data (60) Continuation-in-part of application No. 10/713,327, filed on Nov. 13, 2003, now Pat. No. 6,858,905, which is a division of application No. 09/893,830, filed on Jun. 28, 2001, now Pat. No. 6,693,821, and a continuation-in-part of application No. 10/345,547, filed on Jan. 15, 2003, now Pat. No. 6,861,687, which is a division of application No. 09/894,922, filed on Jun. 28, 2001, now Pat. No. 6,531,371.

(51) Int. Cl.[7] .............................................. G11C 11/00
(52) U.S. Cl. ....................... 365/158; 365/206; 365/207; 365/208
(58) Field of Search ................................. 365/158, 206, 365/207, 208

(56) References Cited

U.S. PATENT DOCUMENTS

| | | | |
|---|---|---|---|
| 3,838,405 A | 9/1974 | Arnett et al. |
| 5,410,504 A | 4/1995 | Ward |
| 5,508,953 A | 4/1996 | Fukuda et al. |
| 5,579,258 A | 11/1996 | Adachi |
| 5,640,343 A | 6/1997 | Gallagher et al. |
| 5,712,612 A | 1/1998 | Lee et al. |
| 5,792,569 A | 8/1998 | Sun et al. |
| 5,991,193 A | 11/1999 | Gallagher et al. |
| 6,128,214 A | 10/2000 | Kuekes et al. |
| 6,198,208 B1 | 3/2001 | Yano et al. |
| 6,204,139 B1 | 3/2001 | Liu et al. |
| 6,473,332 B1 | 10/2002 | Ignatiev et al. |
| 6,479,848 B2 | 11/2002 | Park et al. |

OTHER PUBLICATIONS

Wu et al., "High Temperature Retention Properties of Ferroelectric PZT/YBCO Heterostructures Investigated by Pyroelectric Current and Phase Detection," 1996, Proceedings of the Tenth IEEE International Symposium on Applications of Ferroelectrics, p. 507–510.

Article entitled, "Electric–pulse–induced reversible resistance change effect in magnetoresistive films", by S. Q. Liu et al., published in Applied Physics Letters, vol. 76, No. 19, May 8, 2000, pp 2749–2751.

Article entitled, "Reproducible Switching Effect in Thin Oxide Films for Memory Applications", by A. Beck et al., published in Applied Physics Letters, vol. 77, No. 1, Jul. 3, 2000, pp. 139–141.

*Primary Examiner*—Son T. Dinh
(74) *Attorney, Agent, or Firm*—David C. Ripma; Joseph P. Curtin (57) ABSTRACT

A method of reading a selected resistive memory bit having its output connected to a bitline, which is connected to a plurality of unselected electrically parallel resistive memory bits, is provided. The method comprises selecting the resistive memory bit to be read by applying a read voltage to an input of the resistive memory bit, and unselecting the plurality of unselected resistive memory bits by applying a deselect voltage to all inputs of the unselected resistive memory bits. The current out of the bitline is then sensed by a current sensor. A memory device is also provided comprising a plurality of resistive memory bits connected to a shared bitline, a means for selecting a single bit from the plurality of resistive memory bits, a means for deselecting the remaining, unselected bits from the plurality of resistive memory bits and a means for sensing the output current from the bitline.

13 Claims, 9 Drawing Sheets

ELECTRICALLY PROGRAMMABLE RESISTANCE CROSS POINT MEMORY SENSING METHOD

CROSS-REFERENCE

This application is a continuation-in-part of U.S. patent application Ser. No. 10/713,327, filed Nov. 13, 2003, now U.S. Pat. No. 6,858,905 entitled Methods of Manufacturing Low Cross-Talk Electrically Programmable Resistance Cross Point Memory Structures, which is a divisional of U.S. patent application Ser. No. 09/893,830, filed Jun. 28, 2001, entitled Low Cross-talk Electrically Programmable Resistance Cross Point Memory, issued Feb. 17, 2004 as U.S. Pat. No. 6,693,821; and a continuation-in-part of U.S. patent application Ser. No. 10/345,547, filed Jan. 15, 2003, now U.S. Pat. No. 6,861,687 entitled Electrically Programmable Resistance Cross Point Memory Structure, which is a divisional of U.S. patent application Ser. No. 09/894,922, filed Jun. 28, 2001, entitled Electrically Programmable Resistance Cross Point Memory, issued Mar. 11, 2003 as U.S. Pat. No. 6,531,371. All of these applications are incorporated herein by reference.

BACKGROUND OF THE INVENTION

This invention relates to nonvolatile memory, and more particularly to a cross point structure utilizing electric pulse induced resistance change effects and methods of detecting the resistance change.

DETAILED DESCRIPTION OF THE INVENTION

Figure 1:
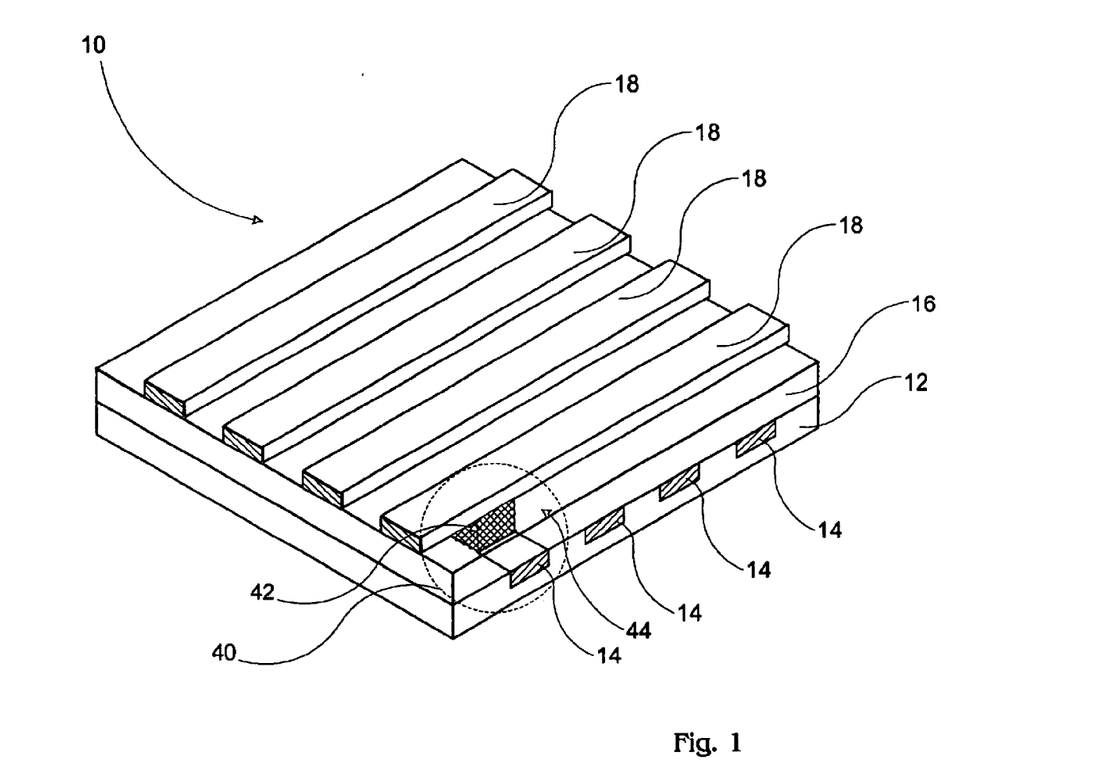
FIG. 1 is an isometric view of a cross point memory array area.

FIG. 1 shows a cross point memory array area 10. The memory array area 10 comprises a substrate 12 with a plurality of bottom electrodes 14 formed thereon. An active layer 16 has been deposited overlying the plurality of bottom electrodes 14. A plurality of top electrodes 18 overly the active layer 16, such that the active layer 16 is interposed between the bottom electrodes 14 and the top electrodes 18.

The top electrodes 18 and the bottom electrodes 14 are each preferably substantially parallel rows. The top electrodes 18 and the bottom electrodes 14 are arranged in a cross point arrangement such that they cross each other in a regular pattern. A cross point refers to each position where a top electrode crosses a bottom electrode. As shown, the top electrodes and the bottom electrodes are arranged at substantially 90 degrees with respect to each other. The top electrodes and the bottom electrodes can each function as either word lines or bitlines as part of a cross point memory array.

FIG. 1 shows just the memory array area. It should be clear that in an actual device, the substrate 12, the bottom electrodes 14 and the top electrodes 18 may extend well beyond the memory array area. As shown here, the active layer is substantially continuous, such that the active layer extends across more than one cross point. Alternatively, the active layer may be patterned to form individual bits at each cross point, as described in U.S. Pat. No. 6,693,821 entitled Low Cross-Talk Electrically Programmable Resistance Cross Point Memory.

The substrate 12 is any suitable substrate material, whether amorphous, polycrystalline or crystalline, such as $LaAlO_3$, Si, TiN or other material.

The bottom electrodes 14 are made of conductive oxide or other conductive material. In a preferred embodiment, the conductive material is a material, such as $YBa_2Cu_3O_7$ (YBCO), that allows the epitaxial growth of an overlying perovskite material. In another preferred embodiment, the conductive material is platinum. The bottom electrodes are a thickness in the range of between about 5 nm and about 500 nm. In a preferred embodiment, the bottom electrodes 14 are formed by forming a trench, depositing the conductive material and polishing the conductive material until level with the substrate. The polishing can be accomplished using chemical mechanical polishing (CMP) or other suitable means. Alternatively, the bottom electrodes may be deposited and patterned without first forming a trench and without polishing.

The active layer 16 is a material capable of having its resistivity changed in response to an electrical signal. The active material is preferably a perovskite material, such as a colossal magnetoresistive (CMR) material or a high temperature superconducting (HTSC) material, for example $Pr_{0.7}Ca_{0.3}MnO_3$ (PCMO). Another example of a suitable material is $Gd_{0.7}Ca_{0.3}BaCo_2O_{5+5}$. The active layer is preferably between about 5 nm and 500 nm thick. The active layer 16 can be deposited using any suitable deposition technique including pulsed laser deposition, rf-sputtering, e-beam evaporation, thermal evaporation, metal organic deposition, sol gel deposition, and metal organic chemical vapor deposition. The active layer is removed from outside the memory array area by ion milling or other suitable process. It is also possible to form a large recessed area to deposit perovskite material over and then use chemical mechanical polishing (CMP) to form an active layer 16.

The top electrodes 18 comprise a conductive material, preferably platinum, copper, silver, or gold.

Figure 2:
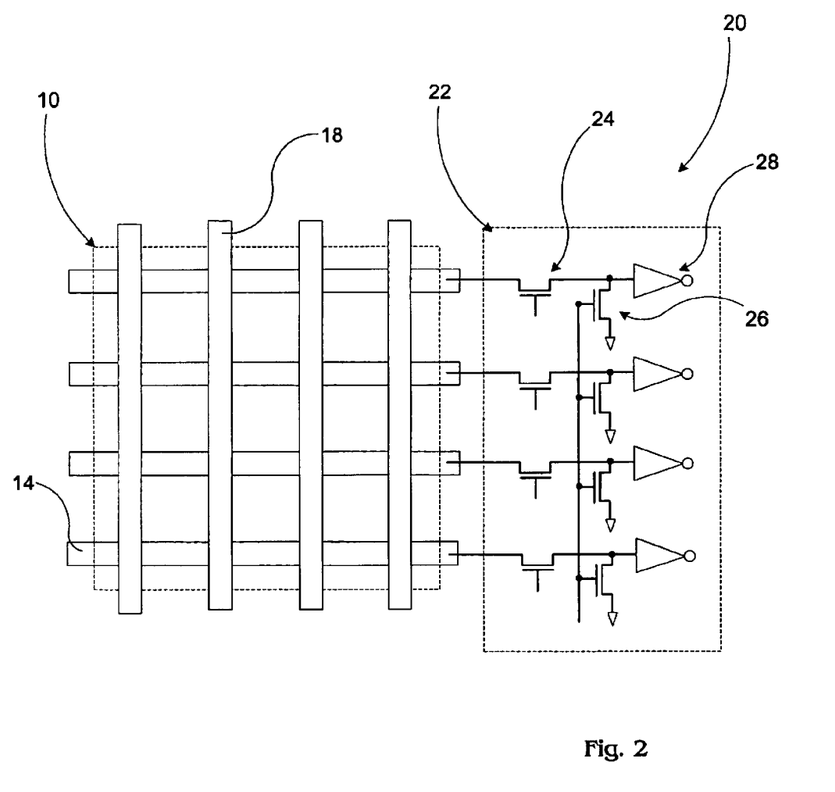
FIG. 2 is a schematic view of a memory readout circuit connected to a cross point memory array area.

Referring now to FIG. 2, a memory device 20 comprising the memory array area 10 connected to a memory output circuit 22 is shown. The memory output circuit 22 as shown comprises at least one bit pass transistor 24 connected to at least one load transistor 26 and at least one inverter 28. These structures are shown schematically, as the formation of the individual semiconductor elements are well known.

Figure 3:
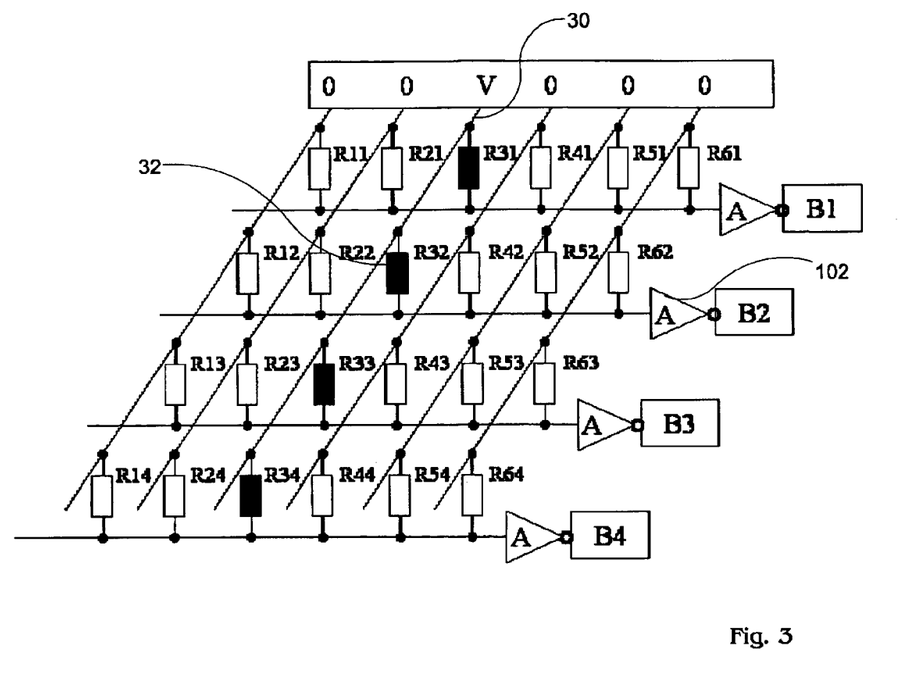
FIG. 3 is a schematic view of a cross point memory device with readout circuit.

FIG. 3 is a diagram of a 5×4 array with readout bit sensors. A word line 30 has been selected by applying a read voltage (V) to the word line 30. Each bit along word line 30, identified as B1 through B4 can then be read out. For example, bit 32 can be read out by the inverter 102, corresponding to B2. This simplified view is for illustration purposes and does not include threshold setting load transistors or other structures that may be present. Focusing now on the readout of bit 32, note that the other bits along bitline B2 are unselected and forced to 0 volts. These unselected bits are effectively in parallel with the input resistance of the inverter 102. In this arrangement, the inverter is acting as a voltage sensing element and typically has a relatively high input resistance of between for example 100 kΩ, or 100 MΩ. As a result of these unselected bits in parallel with the input resistance of the sensing element, the effective load resistance, and the corresponding output voltage from the selected bit 32, is strongly affected by the unselected bits.

Figure 4:
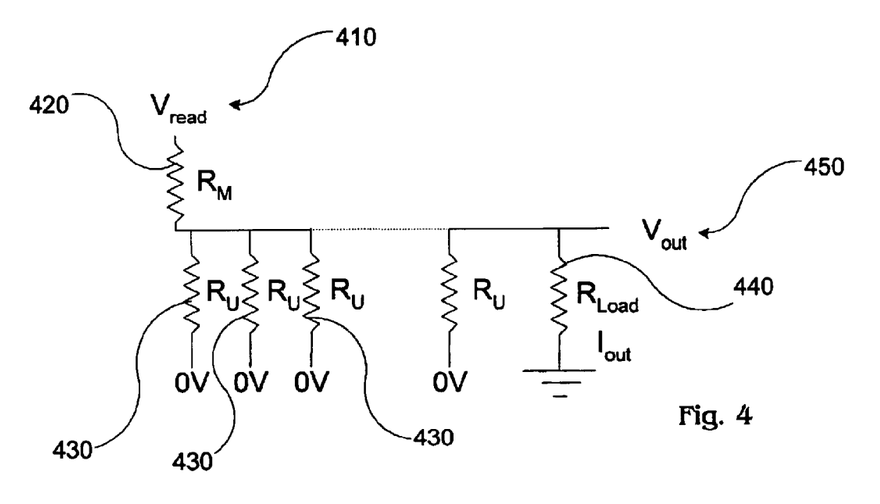
FIG. 4 is a schematic view of a selected memory bit ($R_M$) and unselected memory bits ($R_U$) along a common bitline shown as resistors.

FIG. 4 shows a further simplified diagram of the bits along bitline B2. A read voltage 410 ($V_{read}$) is applied to the desired bit 420 (R32), which is illustrated here by the memory resistance $R_M$. The unselected bits 430 are all connected to 0 volts and identified as $R_U$. The load resistance 440, which correspondes to the input impedance of output circuit, is identified as $R_{LOAD}$. The output voltage 450 ($V_{OUT}$) corresponds to the voltage used to read the bit 420. By setting the word line connected to the desired bit to the read voltage, the desired bit is selected. The remaining unselected bits are deselected by applying a deselect voltage, which is different from the read voltage. In the examples shown in FIGS. 4 and 5, the deselect voltage is 0 volts, although this is not required. A voltage lower than the read voltage, or a negative voltage may be used for example.

Figure 5:
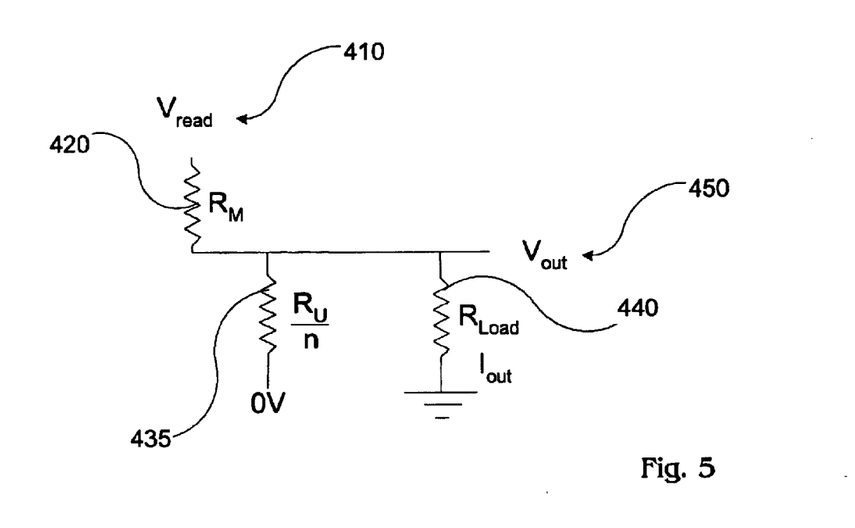
FIG. 5 is a schematic view as in FIG. 4, but with the unselected memory bits replaced by a single equivalent resistance.

If for purposes of illustration, we assume that all of the unselected bits have the same resistance value, $R_U$, then the total resistance 435 of all unselected bits in parallel is simply $R_U$ divided by n, where n is the number of unselected bits along the bitline. This further simplified model is shown in FIG. 5. Based upon the circuit diagram shown in FIG. 5, we can determine the output voltage as a function of the number of unselected bits along the bitline.

$$Vout(n) = \frac{\frac{R_U}{n} * R_{LOAD}}{\frac{R_U}{n} * R_{LOAD} + R_M\left(\frac{R_U}{n} * R_{LOAD}\right)} * V_{read}$$

Figure 6:
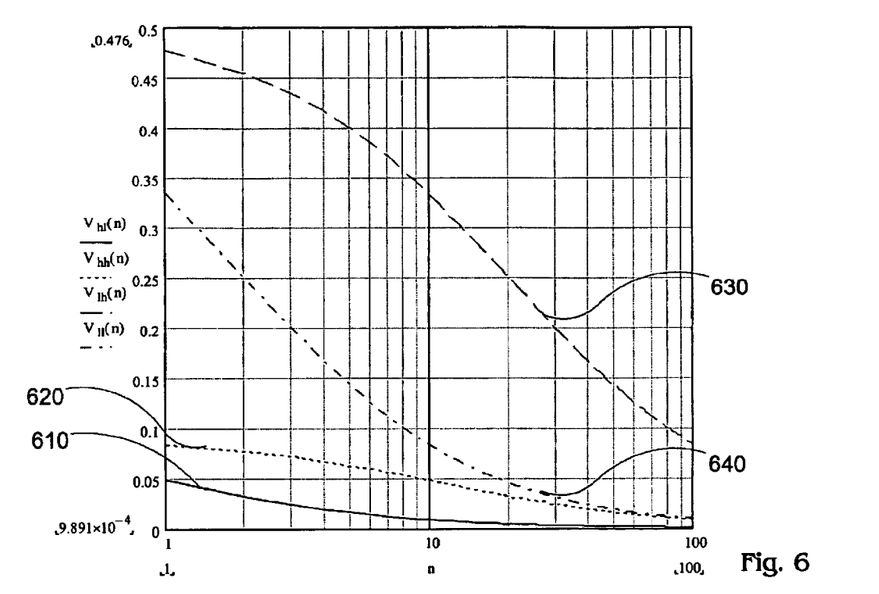
FIG. 6 is a plot of output voltage as a function of the number of unselected bits based on using a voltage sensor.
Figure 7:
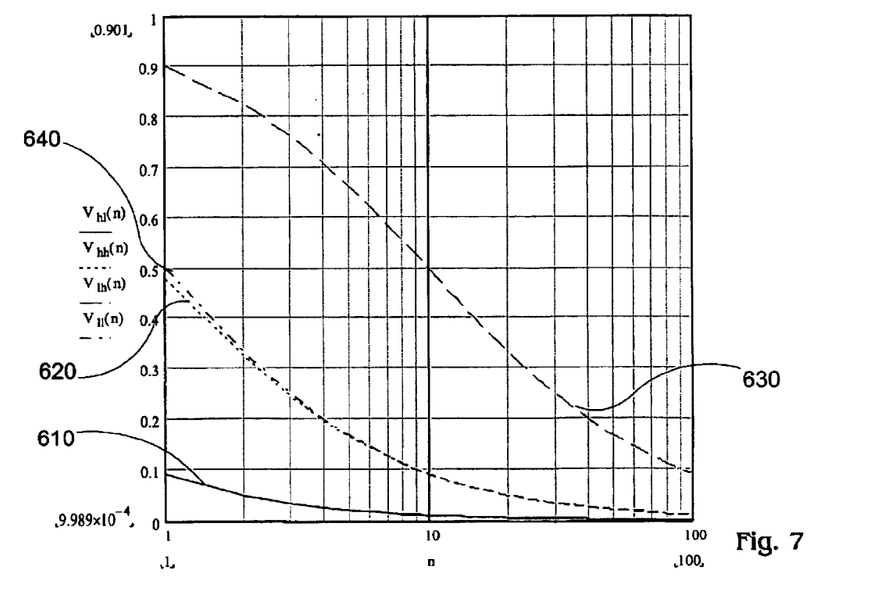
FIG. 7 is a plot of output voltage as a function of the number of unselected bits based on using a voltage sensor.

Since it is assumed for the purpose of this illustration that all unselected bits are at the same resistance value, there are four possible conditions that this resistive memory array voltage calculation can illustrate. FIGS. 6 and 7 show graphs of the output voltage as a function of the number of unselected bits n. First, the selected bit is in a high resistance state, while the unselected bits are in low resistance state, which will correspond to $V_{hl}(n)$. Second, the selected bit is in a high resistance state, while the unselected bits are also in a high resistance state, which will correspond to $V_{hh}(n)$. Third, the selected bit is in a low resistance state, while the unselected bits are in a high resistance state, which will correspond to $V_{lh}(n)$. And fourth, the selected bit is in a low resistance state, while the unselected bits are also in a low resistance state, which will correspond to $V_{ll}(n)$.

FIG. 6 shows a plot of the four conditions based on a high resistance value of 10,000 ohms for the resistive memory bits, a low resistance value of 1000 ohms for the resistive memory bits, and a load resistance of 1000 ohms. The read voltage is set to 1V. The number of unselected bits (n) is from 1 to 100, and is plotted on a log scale. The first curve 610, which corresponds to $V_{hl}(n)$, and the second curve 620, which corresponds to $V_{hh}(n)$, both show a low voltage output because the selected bit is in a high resistance state. The third curve 630, which corresponds to $V_{lh}(n)$, and the fourth curve 640, which corresponds to $V_{ll}(n)$, both show a noticeably higher output voltage for low values of n due to the low resistance state of the selected bit. However, as n increases, the output voltage when the selected bit in the low resistance state decreases as the influence of the unselected bit increases. As the number of unselected bits increases beyond 10, the output voltage $V_{ll}(n)$ converges with the output voltage $V_{hh}(n)$. Eventually it would become essentially impossible to resolve a high resistance bit from a low resistance bit due to the influence of the unselected bits in parallel with the load resistance.

In FIG. 7, the load resistance is 100,000 ohms, while all other values remain the same. Here even at small n values it is difficult to resolve the difference between the output voltages corresponding to $V_{ll}(n)$ and $V_{hh}(n)$. This indicates that it will be difficult to utilize large memory arrays using a simple voltage sensor to resolve the resistance change of the selected bit.

Modern memories can be made quite large, having on the order of thousands, or even millions, of bits. For large memory arrays, it would be desirable be able to have a large number of word lines to access the large array.

The problems illustrated in FIGS. 6 and 7 are due in part to the use of a voltage sensor to read the change in resistance of the selected bit. An ideal voltage sensor would have an input resistance approaching infinity. This means that the load resistance of the bitline approaches infinity in the case of an ideal voltage sensor. In actuality, as illustrated above the load resistance can be on the order of thousands or even hundreds of thousands of ohms.

Accordingly, an alternative is provided by the present method. The present method of sensing the change in resistance of the selected bit senses the current, instead of the voltage. An ideal current sensor will have a input resistance of 0 ohms, so the load resistance connected to the selected memory bit will ideally be 0 ohms. Although an actual current sensor will not have a 0 ohms resistance, a load resistance on the order of less than 10 ohms, or even a fraction of an ohm are achievable. The current $I_{out}$ through the load resistance $R_{LOAD}$ generally corresponds to the voltage $V_{out}$ divided by $R_{LOAD}$, so that:

$$I_{out}(n) = \frac{\frac{\frac{R_U}{n} * R_{LOAD}}{\frac{R_U}{n} * R_{LOAD} + R_M\left(\frac{R_U}{n} * R_{LOAD}\right)} * V_{read}}{R_{LOAD}}$$

$$I_{out}(n) = \frac{\frac{R_U}{n}}{\frac{R_U}{n} * R_{LOAD} + R_M\left(\frac{R_U}{n} * R_{LOAD}\right)} * V_{read}$$

Figure 8:
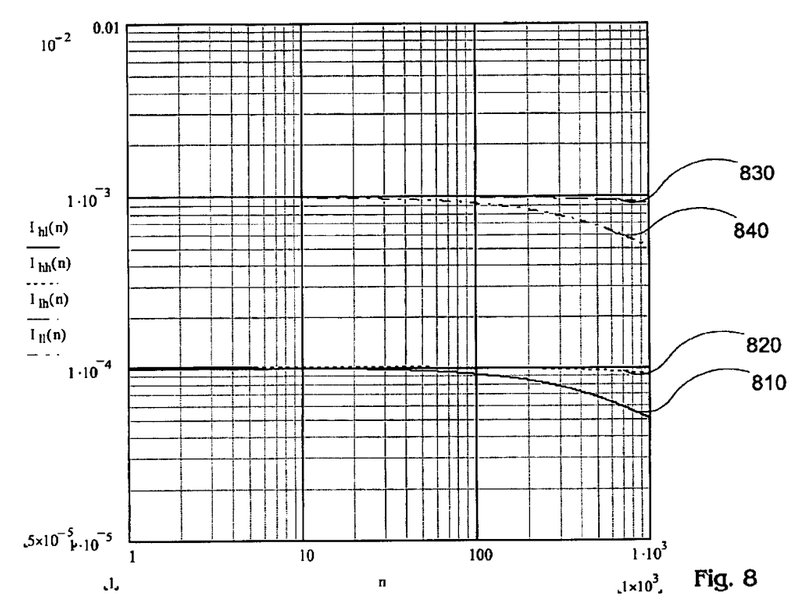
FIG. 8 is a plot of output current as a function of the number of unselected bits based on using a current sensor.
Figure 10:
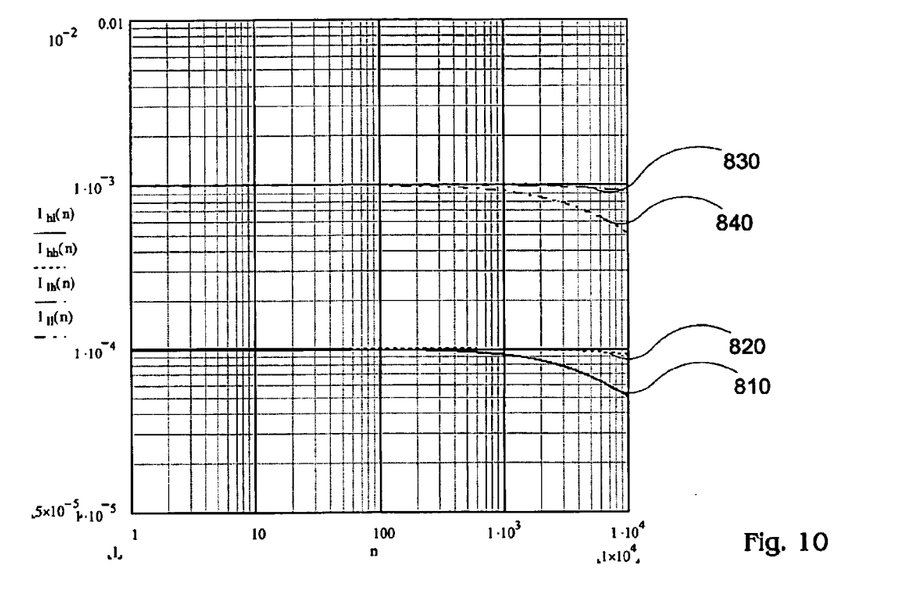
FIG. 10 is a plot of output current as a function of the number of unselected bits based on using a current sensor.
Figure 11:
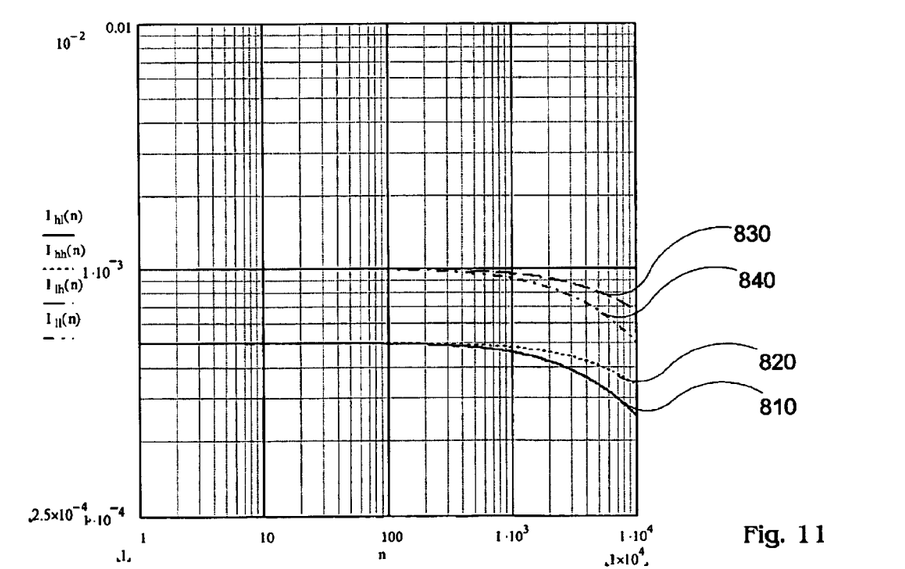
FIG. 11 is a plot of output current as a function of the number of unselected bits based on using a current sensor.

Since it is assumed for the purpose of this illustration that all unselected bits are at the same resistance value, there are four possible conditions that this resistive memory array output current calculation can illustrate. FIGS. 8, 10, and 11 show graphs of the output current as a function of the number of unselected bits n. First, the selected bit is in a high resistance state, while the unselected bits are in low resistance state, which will correspond to $I_{hl}(n)$. Second, the selected bit is in a high resistance state, while the unselected bits are also in a high resistance state, which will correspond to $I_{hh}(n)$. Third, the selected bit is in a low resistance state, while the unselected bits are in a high resistance state, which will correspond to $I_{lh}(n)$. And fourth, the selected bit is in a low resistance state, while the unselected bits are also in a low resistance state, which will correspond to $I_{ll}(n)$.

FIG. 8 shows a plot of the four conditions based on a high resistance value of 10,000 ohms for the resistive memory bits, a low resistance value of 1000 ohms for the resistive memory bits, and a load resistance of 1 ohm. The read voltage is set to 1V. The number of unselected bits (n) is from 1 to 1000, and is plotted on a log scale. In FIG. 8 the output current is also plotted on a log scale. The first curve 810, which corresponds to $I_{hl}(n)$, and the second curve 820, which corresponds to $I_{hh}(n)$, both show a low current output because the selected bit is in a high resistance state. The third curve 830, which corresponds to $I_{lh}(n)$, and the fourth curve 840, which corresponds to $I_{ll}(n)$, both show a noticeably higher output current. Even as n increases, the output current when the selected bit is in the high resistance state, or the low resistance state is not noticeably affected until n is greater than 100. Even as n reaches 1000, it would be possible to resolve whether the selected bit is in a high resistance state or a low resistance state regardless of the condition of the unselected bits.

Figure 9:
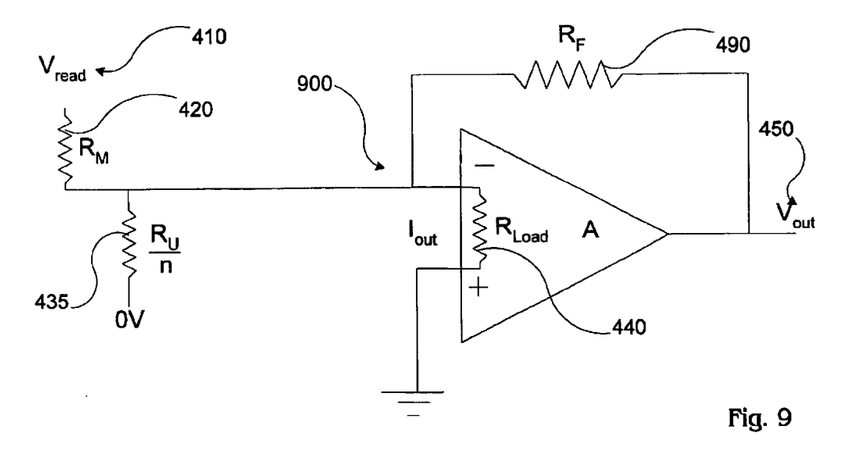
FIG. 9 is a schematic view of an op amp circuit used as a current sensor.

A normal operational amplifier 900 (op amp) configured in a transimpedence, also referred to as transresistance, mode as shown schematically in FIG. 9 can satisfy the above conditions. An op amp current sensor can be integrated into the fabrication process used to manufacture the memory array. The op amp components may be fabricated prior to the formation of the memory array. The effective load resistance across the inputs of an op amp as shown in FIG. 9, is given by the feedback resistor ($R_F$) divided by, 1 plus the open loop gain (A), ($R_{LOAD}=R_F/(1+A)$). The output voltage from the op amp $V_{out}$ is approximately equal to the output current through the load resistor times the feedback resistor ($V_{out}=I_{out}*RF$). Based on the values used for the examples shown in FIG. 8, a feedback resistor selected at 1 kΩ would produce an output voltage of between approximately 0.1 volt and 1 volt based upon the resistance value of the selected memory bit, $R_M$. Based on a 1 kΩ feedback resistor value, for a common op amp with say an open loop gain of 20,000, the effective load resistance at the op amp input would be 0.05 ohms.

FIG. 10 shows a plot of the four conditions based on a high resistance value of 10,000 ohms for the resistive memory bits, a low resistance value of 1000 ohms for the resistive memory bits, and a load resistance of 0.1 ohm. The read voltage is set to 1V. The number of unselected bits (n) is from 1 to 10,000, and is plotted on a log scale. In FIG. 10, the output current is also plotted on a log scale. The first curve 810, which corresponds to $I_{hl}(n)$, and the second curve 820, which corresponds to $I_{hh}(n)$, both show a low current output because the selected bit is in a high resistance state. The third curve 830, which corresponds to $I_{lh}(n)$, and the fourth curve 840, which corresponds to $I_{ll}(n)$, both show a noticeably higher output current. Even as n increases, the output current when the selected bit is in the high resistance state, or the low resistance state is not noticeably affected until n is greater than 1,000. Even as n reaches 10,000, it would be possible to resolve whether the selected bit is in a high resistance state or a low resistance state regardless of the condition of the unselected bits.

An additional possible benefit of using a current sensor to sense the resistance level of the selected bits is the ability to reduce the ratio of the high resistance state to the low resistance state. In the previous examples, the high resistance value has been a factor of ten times larger than the low resistance value. FIG. 11, shows a plot of the four conditions based on a high resistance value of 2,000 ohms for the resistive memory bits, a low resistance value of 1000 ohms for the resistive memory bits, and a load resistance of 0.1 ohm. The read voltage is set to 1V. The number of unselected bits (n) is from 1 to 10,000, and is plotted on a log scale. In FIG. 10, the output current is also plotted on a log scale. The first curve 810, which corresponds to $I_{hl}(n)$, and the second curve 820, which corresponds to $I_{hh}(n)$, both show a low current output because the selected bit is in a high resistance state. The third curve 830, which corresponds to $I_{lh}(n)$, and the fourth curve 840, which corresponds to $I_{ll}(n)$, both show a noticeably higher output current. Even as n increases, the output current when the selected bit is in the high resistance state, or the low resistance state is not noticeably affected until n is greater than 1,000. Even as n reaches 10,000, it would be possible to resolve whether the selected bit is in a high resistance state or a low resistance state regardless of the condition of the unselected bits. Even at n=10,000 the output voltage from the op amp, using a 1 kΩ feedback resistor, would be 0.5 volts when the selected resistor is in the low resistance state and all the unselected resistors were also in the low resistance state, and approximately 0.33 volts when the selected resistor is in the high resistance state and all the unselected resistors are also in the high resistance state. This voltage difference can be readily resolved by a subsequent device stage.

Although a current sensor is being used to sense the resistance change of the selected bit on a given bitline, subsequent devices may be used to resolve the on or off condition. For example, in the case of a transimpedence op amp, an out voltage may be supplied to subsequent circuitry to generate a one or a zero. Alternatively, if the bits have more than two resistivity levels, for example in the case of a non-binary configuration, subsequent circuitry may be used to resolve the value associate with the selected bit.

Figure 12:
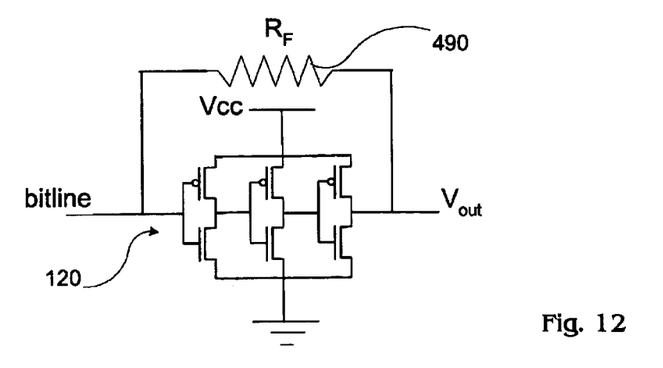
FIG. 12 shows a simple three stage cascade inverter with feedback resistor ($R_F$).

Although we have provided an example of an op amp used as the current sensor, other current sensing devices may be used. For example, the output current sensing device may be a simple odd stage cascade inverter with a feedback resistor ($R_F$). FIG. 12 shows a simple three stage cascade inverter 120 with feedback resistor ($R_F$) 490.

Figure 13:
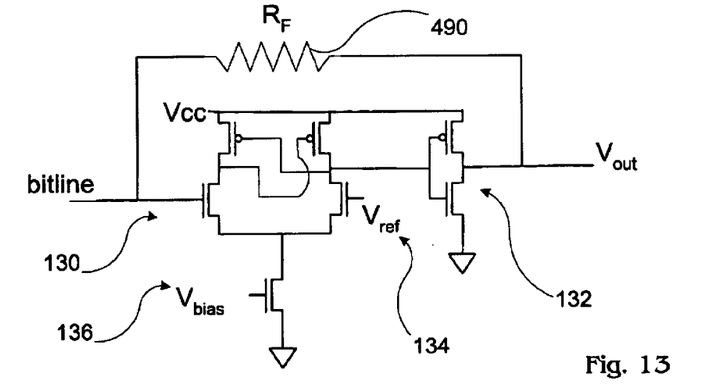
FIG. 13 shows a differential amplifier followed by an inverter with a feedback resistor ($R_F$).

Differential amplifiers may also be used as output current sensing devices. FIG. 13 shows a differential amplifier 130 followed by an inverter 132 with a feedback resistor ($R_F$) 490. A reference voltage ($V_{ref}$) 134 along with bias volatage ($V_{bias}$) 136 are also shown.

Figure 14:
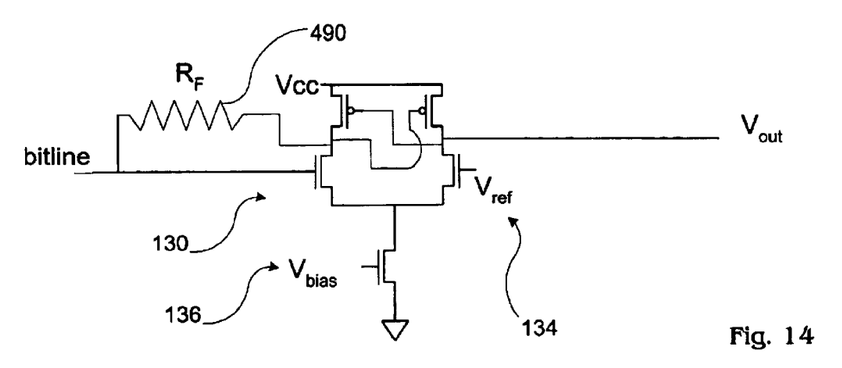
FIG. 14 shows a differential amplifier without an inverter, but with a feedback resistor ($R_F$).

FIG. 14 shows a differential amplifier 130 without an inverter, but with a feedback resistor ($R_F$) 490. A reference voltage ($V_{ref}$) 134 along with bias volatage ($V_{bias}$) 136 are also shown.

Figure 15:
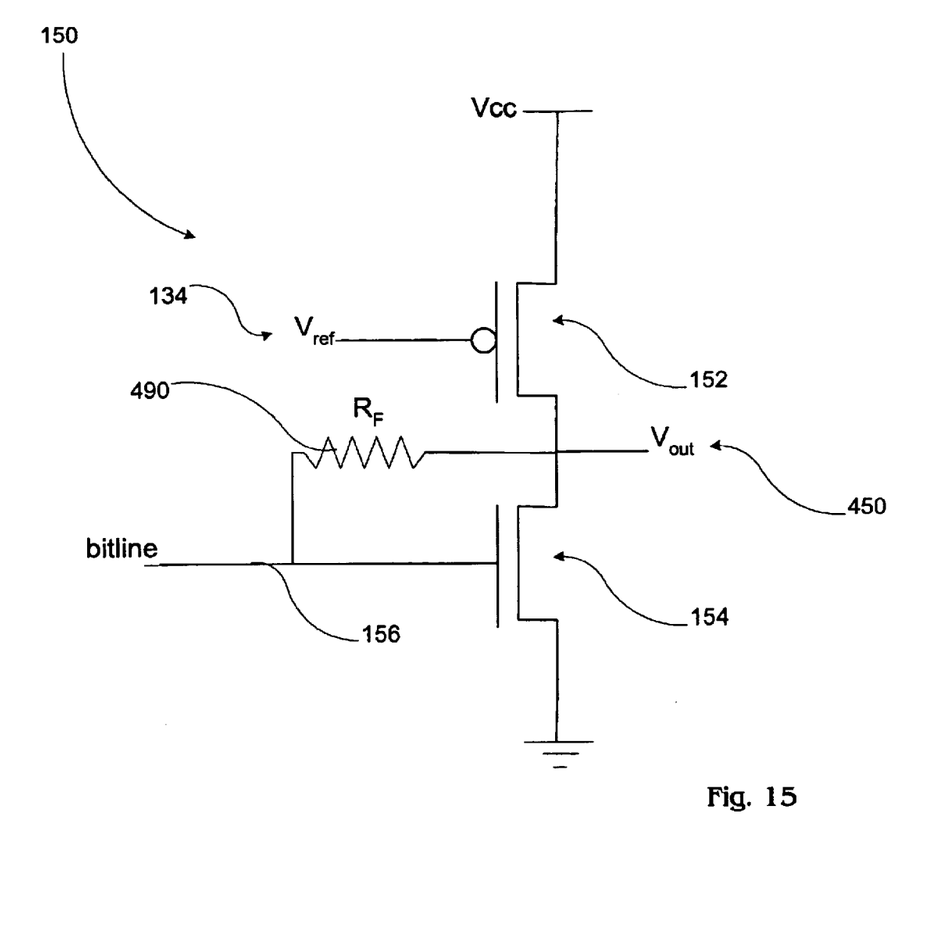
FIG. 15 shows a simple CMOS device for use as a current sensor.

FIG. 15 shows a simple CMOS current sensor 150. A PMOS transistor 152, with a reference voltage ($V_{ref}$) 134 connected to the PMOS gate, connected to an NMOS transistor 154, with a bitline 156 connected to the NMOS gate, and a feedback resistor ($R_F$) 490 connected between the bitline and the voltage output ($V_{out}$) 450, where the voltage output is connected where the PMOS transistor is connected to the NMOS transistor.

The examples of current sensing devices shown, including op amps, odd stage cascade inverters, and differential amplifiers all utilize feedback resistors. These resistors may be provided by any suitable means. When integrating these components into a MOS process, the resistors may be formed using polysilicon, or other resistive material, or using depletion-mode transistors, as is known in the art.

Although a preferred embodiment, and other embodiments have been discussed above, the coverage is not limited to these specific embodiments. Rather, the claims shall determine the scope of the invention.

What is claimed is:

1. A method of reading a selected resistive memory bit having its output connected to a bitline, which is connected to a plurality of unselected electrically parallel resistive memory bits, comprising;
   a) selecting the resistive memory bit to be read by applying a read voltage to an input of the resistive memory bit;
   b) unselecting the plurality of unselected resistive memory bits by applying a deselect voltage to all inputs of the unselected resistive memory bite;
   c) sensing current out of the bitline to road the selected memory bit; and
   wherein sensing current out of the bitline comprises sensing current through an input load of a current sensor with an input impedance of less than 10 ohms.

2. The method of claim 1, wherein the deselect voltage is 0 volts.

3. The method of claim 1, wherein the current sensor has an input impedance of less than 1 ohm.

4. The method of claim 1, wherein the current sensor has an input impedance of less than 0.1 ohms.

5. The method of claim 1, wherein the current sensor is an op amp, an odd stage cascade inverter, a differential amplifier or simple CMOS current sensor.

6. A resistive memory device comprising:
   a) a resistive memory bit to be read connected to a word line and a shared bitline;
   b) a plurality of resistive memory bits connected to a plurality of word lines and the shared bitline;
   c) a current sensing device connected to the bitline; and
   wherein the current sensing device has an input impedance of less than 10 ohms.

7. The resistive memory device of claim 6, wherein the resistive memory bit is a colossal magnetoresistance (CMR) material.

8. The memory structure of claim 7, wherein the colossal magnetoresistance (CMR) material is $Pr_{0.7}Ca_{0.3}MnO_3$ (PCMO).

9. The memory structure of claim 7, wherein the colossal magnetoresistance (CMR) material is $Gd_{0.7}Ca_{0.3}BaCo_2O_{5+\delta}$.

10. The memory structure of claim 6, wherein the current sensing device has an input impedance of less than 1 ohms.

11. The memory structure of claim 6, wherein the current sensing device has an input impedance of less than 0.1 ohms.

12. The memory structure of claim 6, wherein the current sensing device is an op amp, an odd stage cascade inverter, a differential amplifier or simple CMOS current sensor.

13. A resistive memory device comprising:
   a plurality of resistive memory bits electrically connected to a bitline;
   a means for selecting a single bit connected to the bitline;
   a means for deselecting the plurality of resistive memory bits that have not been selected; and
   a means for sensing an output current from the bitline, the sensing means having an input impedance of less than 10 ohms.

* * * * *